(12) United States Patent
Kim (10) Patent No.: US 10,904,470 B2
(45) Date of Patent: Jan. 26, 2021

(54) RAMP SIGNAL GENERATION DEVICE AND CMOS IMAGE SENSOR INCLUDING THE SAME

(71) Applicant: SK hynix Inc., Gyeonggi-do (KR)

(72) Inventor: Tae-Gyu Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 79 days.

(21) Appl. No.: 16/189,832

(22) Filed: Nov. 13, 2018

(65) Prior Publication Data

US 2019/0289236 A1    Sep. 19, 2019

(30) Foreign Application Priority Data

Mar. 13, 2018    (KR) .................... 10-2018-0029103

(51) Int. Cl.
| | |
|---|---|
| *H04N 5/378* | (2011.01) |
| *H04N 5/3745* | (2011.01) |
| *H03K 4/02* | (2006.01) |
| *H01L 27/146* | (2006.01) |
| *H03M 1/56* | (2006.01) |

(52) U.S. Cl.
CPC ....... *H04N 5/378* (2013.01); *H01L 27/14612* (2013.01); *H01L 27/14643* (2013.01); *H03K 4/02* (2013.01); *H03M 1/56* (2013.01); *H04N 5/37455* (2013.01)

(58) Field of Classification Search
CPC .... H04N 5/378; H04N 5/37455; H04N 5/374; H03K 4/02; H03K 4/023; H01L 27/14612; H01L 27/14643; H03M 1/56; H03M 1/123
See application file for complete search history.

(56) References Cited

U.S. PATENT DOCUMENTS

| | | | |
|---|---|---|---|
| 2003/0076145 A1* | 4/2003 | Mawet .................... | H03H 11/26 327/262 |
| 2011/0019039 A1* | 1/2011 | Ikuma .................... | H04N 5/357 348/246 |
| 2013/0087688 A1* | 4/2013 | Saito .................... | H03K 3/0231 250/208.1 |
| 2014/0375858 A1* | 12/2014 | Lee ........................ | H04N 5/378 327/126 |

(Continued)

FOREIGN PATENT DOCUMENTS

| | | |
|---|---|---|
| JP | 5858695 | 2/2016 |
| KR | 1020130110409 | 10/2013 |

*Primary Examiner* — Nhan T Tran (74) *Attorney, Agent, or Firm* — IP & T Group LLP (57) ABSTRACT

A ramp signal generation device includes a sampling circuit suitable for sampling a ramp current, which flows on a plurality of ramp current paths, and storing a voltage corresponding to the sampled ramp current; a current maintaining circuit suitable for maintaining the ramp current; a current maintaining/transferring circuit suitable for maintaining and transferring a current corresponding to the voltage stored by the sampling circuit; a selection circuit suitable for selecting a ramp current path of the sampling block and the current maintaining/transferring circuit; and a current-to-voltage converter suitable for converting the current transferred from the current maintaining/transferring circuit and generating therefrom a ramp voltage.

19 Claims, 6 Drawing Sheets

(56) References Cited

U.S. PATENT DOCUMENTS

| | | | |
|---|---|---|---|
| 2015/0022249 A1* | 1/2015 | Kinyua | H03K 4/50 |
| | | | 327/134 |
| 2015/0076325 A1* | 3/2015 | Higuchi | H04N 5/357 |
| | | | 250/208.1 |
| 2016/0021323 A1* | 1/2016 | Aibara | H04N 5/378 |
| | | | 348/294 |
| 2016/0315602 A1* | 10/2016 | Sohn | H04N 5/378 |
| 2016/0330387 A1* | 11/2016 | Hwang | H04N 5/357 |
| 2017/0359521 A1* | 12/2017 | Kim | H04N 5/243 |

* cited by examiner

RAMP SIGNAL GENERATION DEVICE AND CMOS IMAGE SENSOR INCLUDING THE SAME

CROSS-REFERENCE TO RELATED APPLICATION

The present application claims priority of Korean Patent Application No. 10-2018-0029103, filed on Mar. 13, 2018, which is incorporated herein by reference in its entirety.

TECHNICAL FIELD

Various embodiments of the present invention relate to a complementary metal oxide semiconductor (CMOS) image sensor. Particularly, embodiments of the present disclosure relate to a ramp signal generation device for reducing a range of a ramp current.

BACKGROUND

Recently, CMOS image sensors having a high frame rate and a high density have been produced. A single-slope analog-to-digital conversion device (SS-ADC) may be used in the CMOS image sensors.

A CMOS image sensor using the SS-ADC may include a ramp signal generation device that is implemented using a current steering digital-to-analog conversion device. In that configuration, a current amount adjusting technique may be used to adjust a gain of the CMOS image sensor.

The ramp signal generation device generates a ramp signal having a ramp voltage corresponding to a ramp current by copying the ramp current using transistors and transferring a copied ramp current to a ramp resistor.

Such a ramp signal generation device has a structure in which an output of a ramp voltage corresponds one-to-one with respect to the variation of the ramp current. That is, the ramp voltage is outputted in one-to-one correspondence with the variation of the ramp current. However, as the resolution of the CMOS image sensor is increased, it is difficult to implement the ramp signal generation device having the above-described structure.

SUMMARY

Various embodiments are directed to a ramp signal generation device for adjusting the output ratio of the ramp voltage with respect to the variation of the ramp current, and a CMOS image sensor including the same.

In an embodiment, a ramp signal generation device may include a sampling circuit suitable for sampling a ramp current, which flows on a plurality of ramp current paths, and storing a voltage corresponding to the sampled ramp current; a current maintaining circuit suitable for maintaining the ramp current; a current maintaining/transferring circuit suitable for maintaining and transferring a current corresponding to the voltage stored by the sampling circuit; a selection circuit suitable for selecting a ramp current path of the sampling block and the current maintaining/transferring circuit; and a current-to-voltage converter suitable for converting the current transferred from the current maintaining/transferring circuit and generating therefrom a ramp voltage.

In an embodiment, a complementary metal-oxide-semiconductor (CMOS) image sensor may include a pixel array, including pixels, suitable for generating a pixel signal corresponding to incident light received at each pixel; a row decoder coupled to the pixel array and suitable for selecting and controlling the pixels of the pixel array row by row; a ramp signal generation device suitable for generating a ramp voltage by adjusting an output ratio of a ramp voltage with respect to variation of a ramp current; a comparison circuit suitable for comparing the ramp voltage from the ramp signal generation device with the pixel signal received from the pixel array; a counting circuit suitable for performing a counting operation based on the comparison signal; a memory circuit suitable for storing information outputted from the counting circuit; a column read-out circuit suitable for outputting the information stored in the memory circuit; and a controller suitable for controlling the row decoder, the ramp signal generation device, the comparison circuit, the counting circuit, the memory circuit, and the column read-out circuit.

DETAILED DESCRIPTION

Various embodiments will be described below in more detail with reference to the accompanying drawings. The present disclosure may, however, be embodied in different forms and thus should not be construed as being limited to the embodiments set forth herein. Rather, these embodiments are provided so that this disclosure is thorough and complete and fully conveys the scope of the present disclosure to those skilled in the art. Throughout the disclosure, like reference numerals refer to like parts throughout the various figures and embodiments of the present disclosure. Also, throughout the specification, reference to "an embodiment," "another embodiment," or the like is not necessarily to the same embodiment, and different references to any such phrase are not necessarily to the same embodiment(s).

It will be understood that when an element is referred to as being "coupled" to another element, it may be directly coupled to the element or electrically coupled thereto with one or more other elements interposed. Furthermore, when an element is referred to as "comprising" or "including" a component, it does not preclude the presence or addition of one or more other components but may further include such other component(s), unless the context clearly indicates otherwise. The terminology used herein is for the purpose of describing particular embodiments and is not intended to be limiting. To that end, numerical identifiers such as "first," "second," "third" etc. are merely used to distinguish elements that otherwise have the same or similar names, e.g., PMOS transistor. Moreover, an element, e.g., PMOS transistor, in the claims identified by a particular numerical identifier does not necessarily correspond to the element, e.g., PMOS transistor, in the specification with that same numerical identifier.

Figure 1:
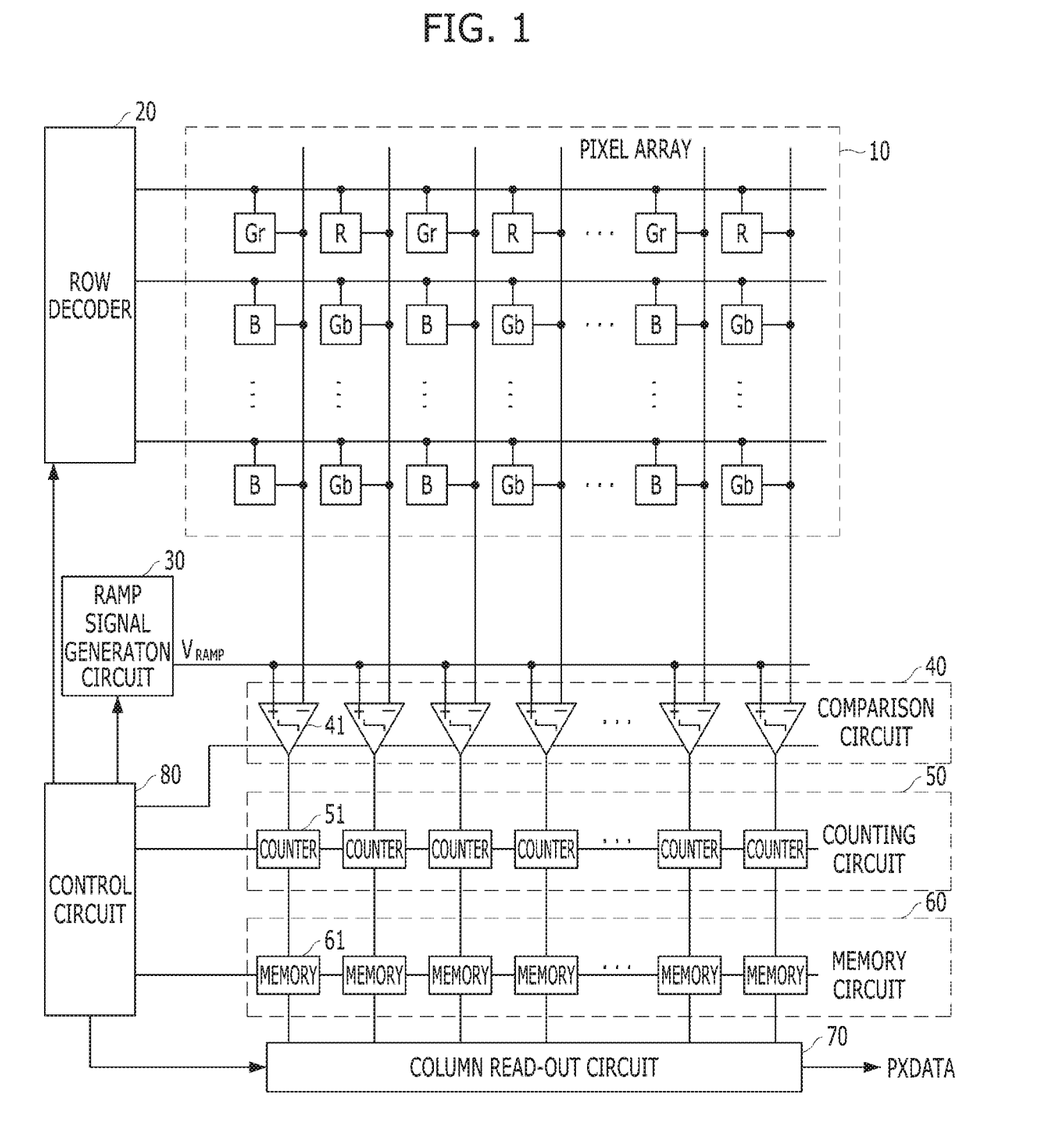
FIG. 1 is a diagram illustrating an example of a CMOS image sensor.

FIG. 1 is a diagram illustrating an example of a complementary metal oxide semiconductor (CMOS) image sensor. The CMOS image sensor shown in FIG. 1 represents a CMOS image sensor having a column parallel structure using a single-slope analog-to-digital conversion device.

Referring to FIG. 1, the CMOS image sensor may include a pixel array 10 including pixels arranged in rows and columns, a row decoder 20, a ramp signal generation circuit 30, a comparison circuit 40, a counting circuit 50, a memory circuit 60, a column read-out circuit 70 and a control circuit 80.

The pixel array 10 may output pixel signals in response to incident light at individual pixels. The row decoder 20 may select and control pixels of the pixel array 10 row by row. The ramp signal generation circuit 30 may generate a ramp signal $V_{RAMP}$ in response to a control signal of the control circuit 80. The comparison circuit 40 may compare the ramp signal $V_{RAMP}$ of the ramp signal generation circuit 30 with each pixel signal outputted from the pixel array 10.

The counting circuit 50 may count the number of clock pulses from the control circuit 80 according to output signals of the comparison circuit 40. The memory circuit 60 may store information (e.g., the number of clock pulses) provided by the counting circuit 50 according to instructions provided by the control circuit 80. The column read-out circuit 70 may output sequentially the information stored in the memory circuit 60 as a pixel data PXDATA according to instructions provided by the control circuit 80. The control circuit 80 may control operations of the row decoder 20, the ramp signal generation circuit 30, the comparison circuit 40, the counting circuit 50, the memory circuit 60 and the column read-out circuit 70.

As such, the CMOS image sensor may include the comparison circuit 40. The comparison circuit 40 may utilize a correlated double sampling (CDS) technique to remove an offset value of the pixel signal.

The comparison circuit 40 may include a plurality of comparators 41, the counting circuit 50 may include a plurality of counters 51, and the memory circuit 60 may include a plurality of memories 61. In an example configuration, each column of the pixel array 10 may include one comparator 41, one counter 51 and one memory 61.

The operations of an exemplary comparator 41, counter 51 and memory 61 will be described below.

The comparator 41 has two input terminals that receive a pixel signal outputted from the corresponding column of the pixel array 10 and a ramp signal $V_{RAMP}$ outputted from the ramp signal generation circuit 30, respectively. The comparator 41 may compare the ramp signal $V_{RAMP}$ with the pixel signal and output a comparison signal in response to a control signal provided by the control circuit 80.

Since a voltage level of the ramp signal $V_{RAMP}$ increases or decreases as time passes, the ramp signal $V_{RAMP}$ may cross the pixel signal at a certain point in time. After this crossing point, the value of the comparison signal outputted from the comparator 41 may be inverted.

The counter 51 may be used to count pulses during a period of time, for example, when a level of the pixel signal is greater than that of the ramp signal. The counter 51 may be initialized by a reset control signal of the control circuit 80.

The memory 61 may store information relating to the count result (e.g., number of pulses) provided by the counter 51 and output the information to the column read-out circuit 70 according to control signals of the control circuit 80. For example, the CMOS image sensor performs a counting operation on a reset signal (e.g., a reset voltage) and then performs a counting operation on an image signal (e.g., a corresponding voltage).

Figure 2A:
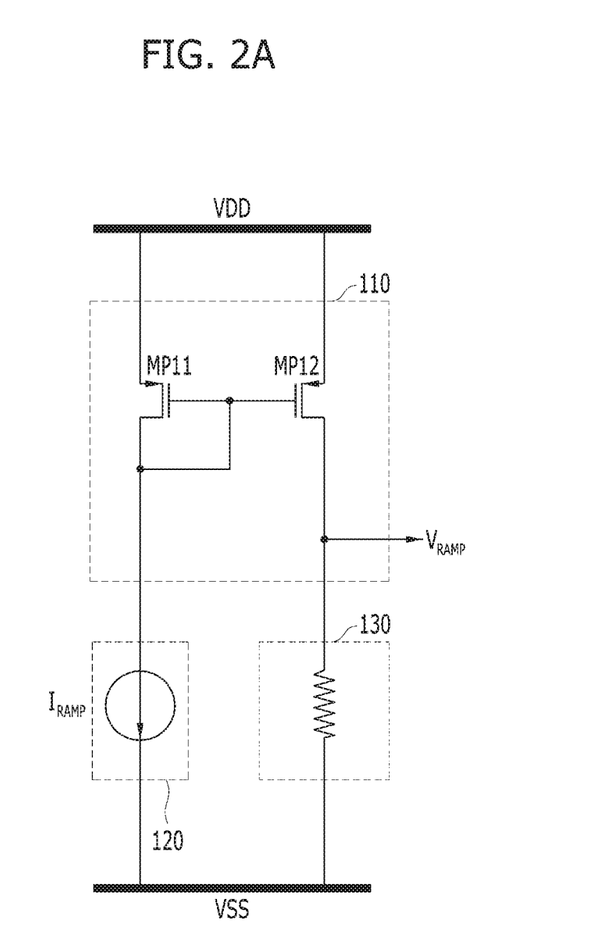
FIG. 2A is a circuit diagram illustrating an example of a ramp signal generation device.

FIG. 2A is a circuit diagram illustrating an example of a ramp signal generation device.

Referring to FIG. 2A, the ramp signal generation device may include a current copy circuit 110, a current maintaining circuit 120 and a current-to-voltage converter 130.

The current copy circuit 110 may copy and transfer a ramp current $I_{RAMP}$. The current maintaining circuit 120 may maintain the ramp current $I_{RAMP}$, which flows on the current copy circuit 110. The current-to-voltage converter 130 may generates a ramp voltage $V_{RAMP}$ corresponding to the ramp current $I_{RAMP}$ transferred from the current copy circuit 110.

The current copy circuit 110 may include a first PMOS transistor MP11 and a second PMOS transistor MP12. A source terminal of the first PMOS transistor MP11 is coupled to a terminal for a power supply voltage VDD. The PMOS transistor MP11 has a diode-connection structure that a gate terminal of the first PMOS transistor MP11 is coupled to a drain terminal of the first PMOS transistor MP11. A source terminal of the second PMOS transistor MP12 is coupled to the power supply voltage VDD terminal. A gate terminal of the second PMOS transistor MP12 is coupled to the gate terminal of the first PMOS transistor MP11, and a drain terminal of the second PMOS transistor MP12 is coupled to an output node for outputting the ramp voltage $V_{RAMP}$.

The current maintaining circuit 120 may be implemented using a current source. A first terminal of the current source is coupled to the drain terminal of the first PMOS transistor MP11 and a second terminal of the current source is coupled to a terminal for a ground voltage VSS.

The current-to-voltage converter 130 may be implemented using a ramp resistor. A first terminal of the ramp resistor is coupled to the output node and a second terminal of the ramp resistor is coupled to the ground voltage VSS terminal.

As described above, the ramp signal generation device shown in FIG. 2A uses the first PMOS transistor MP11 and the second PMOS transistor MP12 in order to copy and transfer the ramp current $I_{RAMP}$ to the ramp resistor.

That is, in the ramp signal generation device shown in FIG. 2, when the ramp current $I_{RAMP}$ flows through the first PMOS transistor MP11 having the diode-connection structure, the ramp current $I_{RAMP}$ is copied to the second PMOS transistor MP12 by a voltage of the first PMOS transistor MP11, which is applied to the gate terminal of the second PMOS transistor MP12. Thus, the ramp signal having the ramp voltage $V_{RAMP}$ is generated by the copied ramp current, which flows through the ramp resistor.

An output value of the ramp voltage $V_{RAMP}$ is determined by equation 1 as below.

$$V_{RAMP}=I_{RAMP} \times R \qquad \text{(equation 1)}$$

In equation 1, $I_{RAMP}$ represents a ramp current value and R represents a ramp resistance value.

Figure 2B:
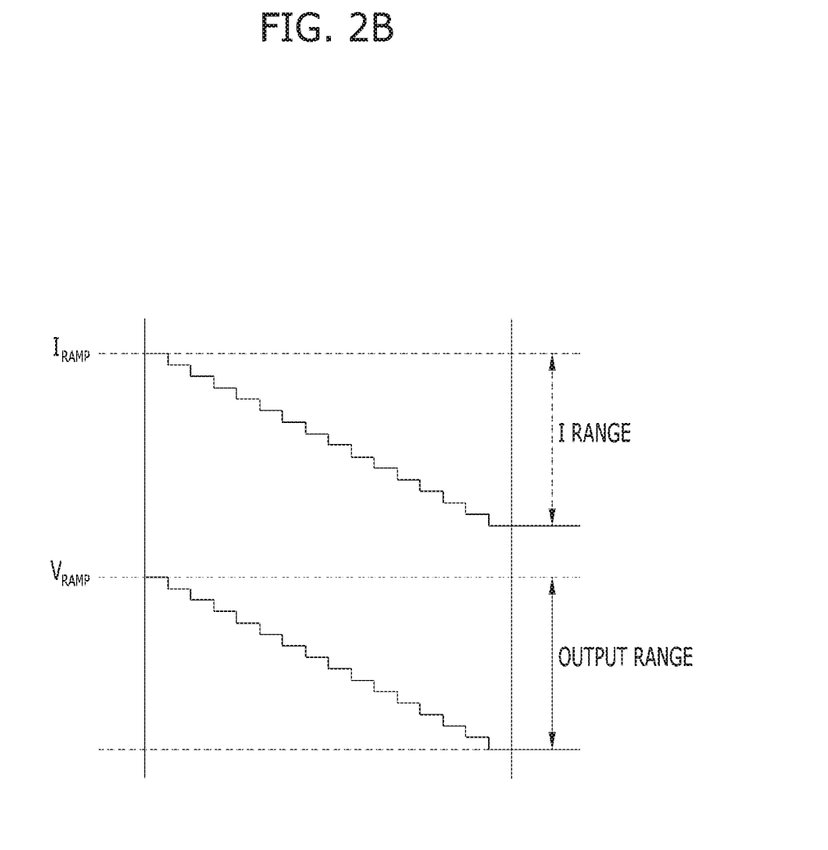
FIG. 2B is a diagram illustrating an output of a ramp voltage according to ramp current variation of the ramp signal generation device shown in FIG. 2A.

Since the ramp signal generation device shown in FIG. 2A has a structure in which an output of a ramp voltage corresponds one-to-one with respect to the variation of the ramp current as shown in FIG. 2B, the ramp current variation is of N-steps (N is natural number) when an output of the ramp voltage of N-steps is demanded. Thus, as the resolution of the CMOS image sensor is increased, it is difficult to implement the ramp signal generation device having the above-described structure.

In embodiments of the present disclosure, a range of the ramp current may be reduced by adjusting an output ratio of the ramp voltage with respect to the ramp current variation. This configuration and operation will be described in detail with reference to FIGS. 3A to 4.

In embodiments of the present disclosure, a case that an output ratio of a ramp voltage with respect to a ramp current variation is one-to-two is described as an example. However, the output ratio of a ramp voltage with respect to a ramp current variation is not so limited. Output ratios of one-to-three, one-to-four or one-to-many may be implemented in accordance with the teachings herein.

Figure 3A:
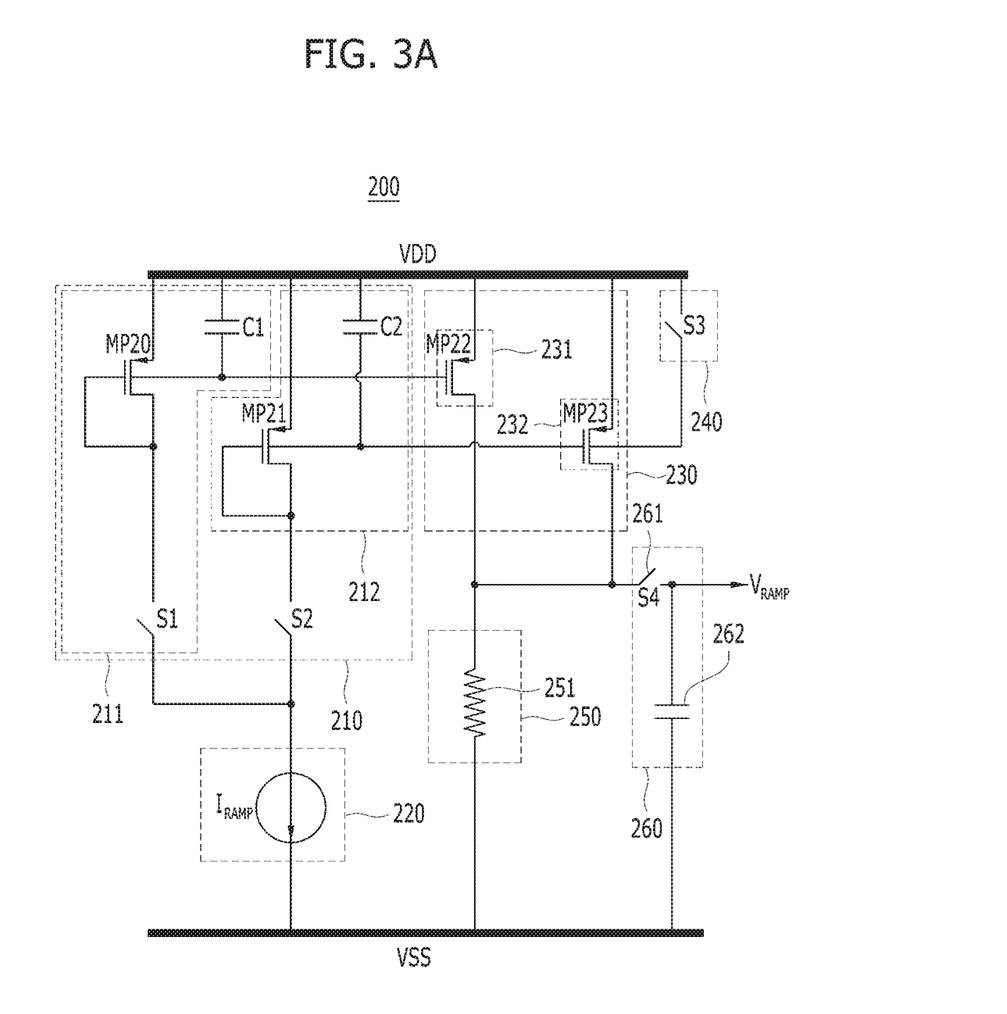
FIG. 3A is a circuit diagram illustrating a ramp signal generation device in accordance with an embodiment of the present disclosure.
Figure 3B:
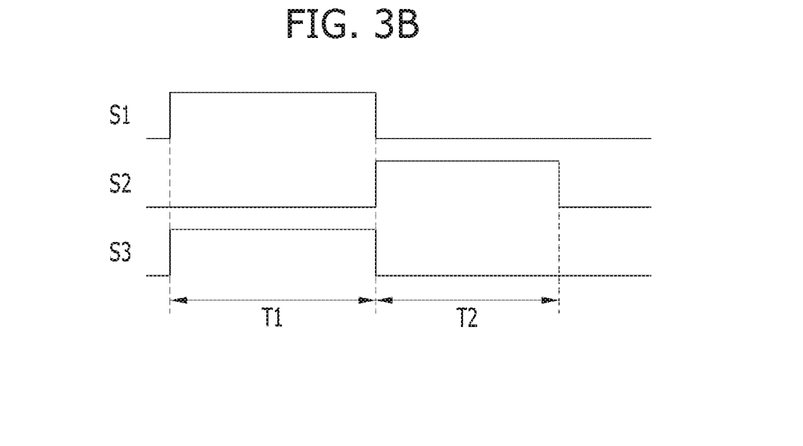
FIG. 3B is a timing diagram illustrating an operation of a ramp signal generation device in accordance with an embodiment of the present disclosure.
Figure 3C:
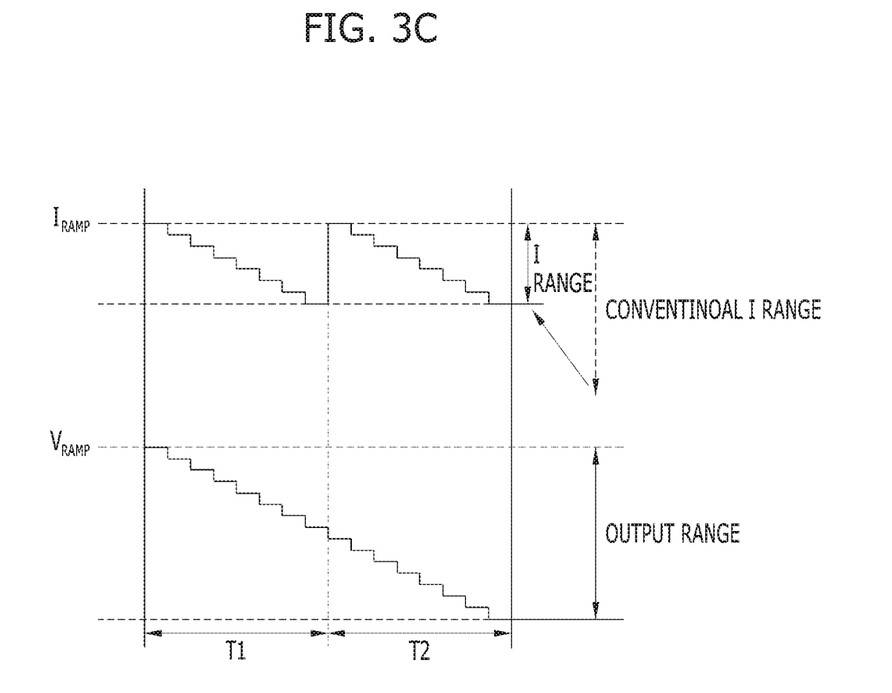
FIG. 3C is a diagram illustrating an exemplary output of a ramp voltage according to ramp current variation of the ramp signal generation device shown in FIG. 3A.

FIG. 3A is a circuit diagram illustrating a ramp signal generation device in accordance with an embodiment of the present disclosure. FIG. 3B is a timing diagram illustrating an operation of a ramp signal generation device in accordance with an embodiment of the present disclosure, for example, the operation of the ramp signal generation device shown in FIG. 3A. FIG. 3C is a diagram illustrating an output of a ramp voltage according to ramp current variation of a ramp signal generation device, for example, such device shown in FIG. 3A.

Referring to FIG. 3A, the ramp signal generation device 200 may include a sampling circuit 210, a current maintaining circuit 220, a current maintaining and transferring (maintaining/transferring) circuit 230, a path selection circuit 240, and a current-to-voltage converter 250.

The sampling circuit 210 may sample the ramp current $I_{RAMP}$, which flows on two ramp signal paths, and store a voltage corresponding to the sampled ramp current. The current maintaining circuit 220 may maintain the ramp current $I_{RAMP}$ at a constant level. The current maintaining/transferring circuit 230 may maintain and transfer a current corresponding to the voltage stored on the sampling circuit 210. The path selection circuit 240 may select a ramp current path of the sampling circuit 210 and the current maintaining/transferring circuit 230. The current-to-voltage converter 250 may generate a ramp voltage $V_{RAMP}$ corresponding to the current transferred from the current maintaining/transferring circuit 230.

The ramp signal generation device 200 may further include an output circuit 260 for stabilizing and outputting the ramp voltage $V_{RAMP}$, which is converted by the current-to-voltage converter 250.

A configuration and an operation of the ramp signal generation device will be described in detail with reference to FIGS. 3A to 3C.

The sampling circuit 210 may include a first sampling circuit 211 and a second sampling circuit 212.

The first sampling circuit 211 may sample a first ramp current, which flows on a first ramp current path, and store a voltage of the sampled first ramp current. The second sampling circuit 212 may sample a second ramp current, which flows on a second ramp current path, and store a voltage of the sampled second ramp current. In a configuration in which an output ratio of a ramp voltage with respect to a ramp current variation is one-to-many, the sampling circuit 210 may be implemented to have many, e.g., a corresponding number of sampling circuits.

The first sampling circuit 211 may include a first PMOS transistor MP20, a first capacitor C1 and a first switch S1. A source terminal of the first PMOS transistor MP20 may be coupled to a terminal for a power supply voltage VDD.

The first PMOS transistor MP20 may have a diode-connection structure such that a gate terminal and a drain terminal of the first PMOS transistor MP20 may be coupled to each other.

A first terminal of the first capacitor C1 may be coupled to the power supply voltage VDD terminal, and a second terminal of the first capacitor C1 may be coupled to the gate terminal of the first PMOS transistor MP20. The first capacitor C1 may sample the first ramp current, which flows on the first ramp current path, and store the voltage corresponding to the sampled first ramp current.

The first switch S1 may be disposed between the drain terminal of the first PMOS transistor MP20 and the current maintaining circuit 220, and switch on or off the first ramp current, which flows on the first ramp current path.

The second sampling circuit 212 may include a second PMOS transistor MP21, a second capacitor C2 and a second switch S2.

A source terminal of the second PMOS transistor MP21 may be coupled to the power supply voltage VDD terminal. The second PMOS transistor MP21 may have a diode-connection structure such that a gate terminal and a drain terminal of the second PMOS transistor MP21 may be coupled to each other.

A first terminal of the second capacitor C2 may be coupled to the power supply voltage VDD terminal, and a second terminal of the second capacitor C2 may be coupled to the gate terminal of the second PMOS transistor MP21. The second capacitor C2 may sample the second ramp current, which flows on the second ramp current path, and store the sampled second ramp current.

The second switch S2 may be disposed between the drain terminal of the second PMOS transistor MP21 and the current maintaining circuit 220, and switch on or off the second ramp current, which flows on the second ramp current path.

The current maintaining circuit 220 may be implemented with a current source having a first terminal coupled to both the first switch S1 and the second switch S2, and a second terminal coupled to a ground voltage VSS terminal.

The current maintaining/transferring circuit 230 may include a current maintaining/transferring element 231 and a current transferring element 232, which may be suitable transistors.

The current maintaining/transferring element 231 may maintain and transfer the current corresponding to the voltage stored in the first sampling circuit 211 of the sampling circuit 210. The current transferring element 232 may transfer the current corresponding to the voltage stored in the second sampling circuit 212 of the sampling circuit 210.

If an output ratio of a ramp voltage with respect to a ramp current variation is one-to-many, the current maintaining/transferring circuit 230 may be implemented with many, e.g., a corresponding number of current maintaining/transferring elements.

The current maintaining/transferring element 231 may include a third PMOS transistor MP22. A source terminal of the third PMOS transistor MP22 may be coupled to the power supply voltage VDD terminal. A gate terminal of the third PMOS transistor MP22 may be coupled to the gate terminal of the first PMOS transistor MP20. A drain terminal of the third PMOS transistor MP22 may be coupled to the current-to-voltage converter 250.

The current transferring element 232 may include a fourth PMOS transistor MP23. A source terminal of the fourth PMOS transistor MP23 may be coupled to the power supply voltage VDD terminal. A gate terminal of the fourth PMOS transistor MP23 may be coupled to the gate terminal of the second PMOS transistor MP21 of the sampling circuit 210 and the path selection circuit 240. A drain terminal of the fourth PMOS transistor MP23 may be coupled to the current-to-voltage converter 250.

The path selection circuit 240 may include a third switch S3. A first terminal of the third switch S3 may be coupled to the power supply voltage VDD terminal. A second terminal of the third switch S3 may be coupled to the gate terminal of the second PMOS transistor MP21 of the second sampling circuit 212 and the gate terminal of the fourth PMOS transistor MP23 of the current transferring element 232. The third switch S3 may allow the ramp current to flow through two ramp current paths by additionally selecting a ramp current path after the ramp current flows on a single ramp current path at an initial start point.

If an output ratio of a ramp voltage with respect to a ramp current variation is one-to-many, the path selection circuit 240 may be implemented with many, e.g., a corresponding number of switches.

The current-to-voltage converter 250 may include a ramp resistor 251. The ramp resistor 251 may be disposed between the current maintaining/transferring circuit 230 and the ground voltage VSS terminal. The ramp resistor 251 may generate a ramp voltage $V_{RAMP}$ corresponding to the current transferred from the current maintaining/transferring circuit 230.

The output circuit 260 may include a fourth switch S4 and a capacitor 262. The fourth switch S4 may be disposed between the current-to-voltage converter 250 and an output node for outputting a ramp voltage $V_{RAMP}$. The capacitor 262 may be coupled between the output node and the ground voltage VSS terminal.

As described above, the ramp signal generation device shown in FIG. 3A has two ramp current paths, which is different from the ramp signal generation device shown in FIG. 2A.

That is, in embodiments of the present disclosure, after sampling a ramp current and storing a voltage corresponding to the sampled ramp current, a path for transferring a current corresponding to the stored voltage to a ramp resistor is added. Thus, as shown in FIG. 3C, a range of the ramp current of the ramp signal generation device shown in FIG. 3A (i.e., I range) may be reduced by half that of the ramp current of the ramp signal generation device shown in FIG. 2A (i.e., conventional I range), and the same ramp voltage output may be acquired (i.e., output range).

An operation of the ramp signal generation device of FIG. 3A will be described in detail with further reference to FIGS. 3B and 3C.

At an initial start point, when the first switch S1 and the third switch S3 are switched on and the second switch S2 is switched off, i.e., during T1 period, the ramp current may flow through the first PMOS transistor MP20 and the third PMOS transistor MP22, and gate voltages of the second PMOS transistor MP21 and the fourth PMOS transistor MP23 may be controlled such that gate-source voltages thereof become 0 V (voltage).

Subsequently, when the first switch S1 and the third switch S3 are switched off and the second switch S2 is switched on, i.e., during T2 period, an additional ramp current may flow through ramp current paths of the second PMOS transistor MP21 and the fourth PMOS transistor MP23, which are additionally selected, in a state of maintaining the current of the T1 period through the third PMOS transistor MP22.

Thus, the current-to-voltage converter 250 may generate a ramp voltage $V_{RAMP}$ using combined currents, which flow through the third PMOS transistor MP22 and the fourth PMOS transistor MP23. Thus, the output of the ramp voltage $V_{RAMP}$ may decrease with constant continuity, e.g., in same sized steps.

In this state, when the fourth switch S4 is switched on, a ramp voltage $V_{RAMP}$ corresponding to a ramp resistance and a ramp current may be outputted constantly.

As described above, in embodiments of the present disclosure, as shown in FIG. 3C, a range of the ramp current of the ramp signal generation device shown in FIG. 3A may be reduced by half that of the ramp current of the ramp signal generation device shown in FIG. 2A, and the same ramp voltage output may be acquired.

In another embodiment of the present disclosure, when a current mirror is added, i.e., a ramp current path is added, the same ramp voltage output may be acquired with less ramp current range.

For example, when three current mirrors are used, the same ramp voltage output may be acquired with a third of the ramp current range, which advantageously simplifies the structure of the ramp signal generation device.

Figure 4:
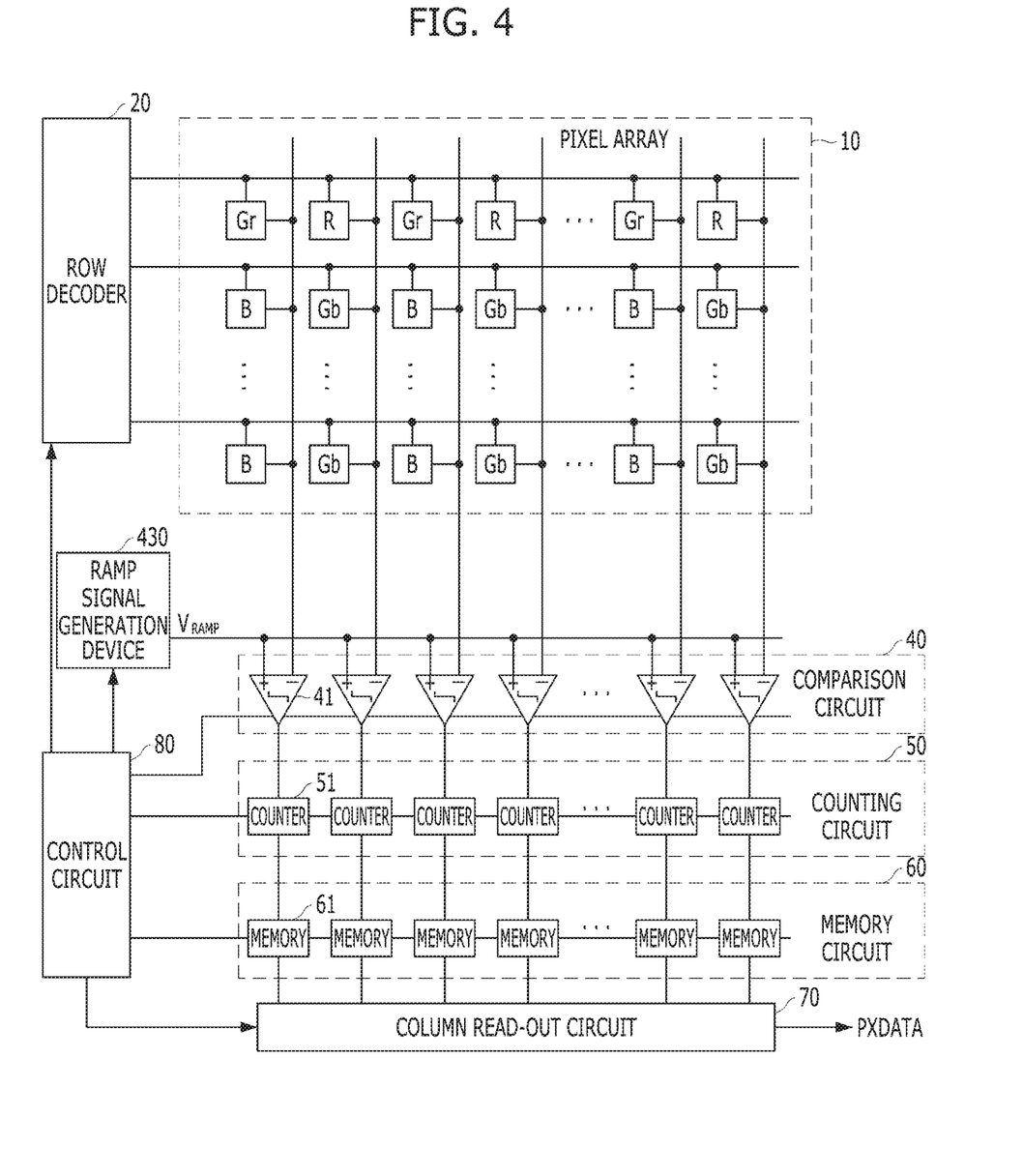
FIG. 4 is a diagram illustrating a CMOS image sensor in accordance with embodiments of the present disclosure.

FIG. 4 is a diagram illustrating an example of a CMOS image sensor in accordance with embodiments of the present disclosure.

Referring to FIG. 4, the CMOS image sensor may include a pixel array 10, a row decoder 20, a ramp signal generation device 430, a comparison circuit 40, a counting circuit 50, a memory circuit 60, a column read-out circuit 70 and a control circuit 80.

The pixel array 10 may output pixel signals corresponding to incident light. The row decoder 20 may select and control pixels of the pixel array 10 row by row. The ramp signal generation device 430 may generate a ramp signal (e.g., ramp voltage) $V_{RAMP}$ in response to a control signal from the control circuit 80. The comparison circuit 40 may compare the ramp signal $V_{RAMP}$ of the ramp signal generation circuit 30 with each pixel signal outputted from the pixel array 10.

The counting circuit 50 may count the number of clock pulses provided from the control circuit 80 according to output signals of the comparison circuit 40. The memory circuit 60 may store information (e.g., the number of clock pulses) provided by the counting circuit 50 according to instructions provided by the control circuit 80. The column read-out circuit 70 may output sequentially the information stored in the memory circuit 60 as a pixel data PXDATA according to instructions provided by the control circuit 80. The control circuit 80 may control operations of the row decoder 20, the ramp signal generation circuit 30, the comparison circuit 40, the counting circuit 50, the memory circuit 60 and the column read-out circuit 70.

The ramp signal generation device 430 may be implemented by the ramp signal generation device 200 shown in FIG. 3A.

As described above, a ramp signal generation device in accordance with embodiments of the present disclosure may adjust the output ratio of the ramp voltage with respect to the variation of the ramp current.

Although various embodiments and specific examples have been described, various changes and modifications may be made, as would be apparent to those skilled in the art in light of what is described and illustrated. Thus, the present invention encompasses all such changes and modifications that fall within the scope of the claims.

What is claimed is:

1. A ramp signal generation device, comprising:
   a sampling circuit configured to sample a ramp current, which flows on a plurality of ramp current paths, and store a voltage corresponding to the sampled ramp current;
   a current maintaining circuit configured to maintain the ramp current;
   a current maintaining/transferring circuit configured to maintain and transfer a current corresponding to the voltage stored by the sampling circuit;
   a selection circuit configured to select a ramp current path of the sampling block and the current maintaining/transferring circuit; and
   a current-to-voltage converter configured to convert the current transferred from the current maintaining/transferring circuit and generating therefrom a ramp voltage.

2. The ramp signal generation device of claim 1, further comprising:
   an output circuit configured to stabilize and output the ramp voltage.

3. The ramp signal generation device of claim 2, wherein the output circuit includes:
   a switch coupled between the current-to-voltage converter and an output node; and
   a capacitor coupled between the output node and a ground voltage terminal.

4. The ramp signal generation device of claim 1, wherein the sampling circuit includes:
   a plurality of sampling elements, each configured to sample the ramp current flowing on a corresponding one of the plurality of ramp current paths, and store the voltage corresponding to the sampled ramp current.

5. The ramp signal generation device of claim 4, wherein each of the plurality of sampling elements includes:
   a first PMOS transistor having a source terminal coupled to a power supply voltage terminal, and having a diode-connection structure such that a gate terminal and a drain terminal are coupled to each other;
   a capacitor having a first terminal coupled to the power supply voltage terminal and a second terminal coupled to the gate terminal of the first PMOS transistor, and configured to sample the ramp current, which flows on the corresponding ramp current path, and store the voltage corresponding to the sampled ramp current; and
   a switch coupled between the drain terminal of the first PMOS transistor and the current maintaining circuit, and configured to switch on or off the ramp current, which flows on the corresponding ramp current path.

6. The ramp signal generation device of claim 5, wherein the current maintaining/transferring circuit includes
   at least one current maintaining/transferring element configured to maintain the current corresponding to the voltage stored in a corresponding sampling block of the sampling circuit; and
   a current transferring element configured to transfer the current corresponding to the voltage stored in the corresponding sampling block of the sampling circuit.

7. The ramp signal generation device of claim 6, wherein the at least one current transferring element includes
   a second PMOS transistor having a source terminal coupled to the power supply voltage terminal, a gate terminal coupled to the gate terminal of the first PMOS transistor of the sampling circuit, and a drain terminal coupled to the current-to-voltage converter.

8. The ramp signal generation device of claim 6, wherein the at least one current transferring element includes
   a third PMOS transistor having a source terminal coupled to the power supply voltage terminal, a gate terminal coupled to the selection circuit and the gate terminal of the first PMOS transistor of the sampling circuit, and a drain terminal coupled to the current-to-voltage converter.

9. The ramp signal generation device of claim 8, wherein the selection circuit includes
   a plurality of switches, each having a first terminal coupled to the power supply voltage terminal, and a second terminal coupled between the gate terminal of the first PMOS transistor of the sampling circuit and the gate terminal of the second PMOS transistor of the current maintaining/transferring circuit, and configured to switch on the corresponding ramp current path such that the ramp current flows through the plurality of ramp current paths.

10. A complementary metal-oxide-semiconductor (CMOS) image sensor, comprising:
    a pixel array, including pixels, configured to generate a pixel signal corresponding to incident light received at each pixel;
    a row decoder coupled to the pixel array and configured to select and control the pixels of the pixel array row by row;
    a ramp signal generation device configured to generate a ramp voltage by adjusting an output ratio of a ramp voltage with respect to variation of a ramp current;
    a comparison circuit configured to compare the ramp voltage from the ramp signal generation device with the pixel signal received from the pixel array;
    a counting circuit configured to perform a counting operation based on the comparison signal;
    a memory circuit configured to store information outputted from the counting circuit;
    a column read-out circuit configured to output the information stored in the memory circuit; and
    a controller configured to control the row decoder, the ramp signal generation device, the comparison circuit, the counting circuit, the memory circuit, and the column read-out circuit.

11. The CMOS image sensor of claim 10, wherein the ramp signal generation device includes:
    a sampling circuit configured to sample a ramp current, which flows on a plurality of ramp current paths, and store a voltage corresponding to the sampled ramp current;
    a current maintaining circuit configured to maintain the ramp current;
    a current maintaining/transferring circuit configured to maintain and transfer a current corresponding to the voltage stored by the sampling circuit;
    a selection circuit configured to select a ramp current path of the sampling block and the current maintaining/transferring circuit; and
    a current-to-voltage converter configured to convert the current transferred from the current maintaining/transferring circuit and generate therefrom a ramp voltage.

12. The CMOS image sensor of claim 11, further comprising:
    an output circuit configured to stabilize and output the ramp voltage.

13. The CMOS image sensor of claim 12, wherein the output circuit includes:
    a switch coupled between the current-to-voltage converter and an output node; and a capacitor coupled between the output node and a ground voltage terminal.

14. The CMOS image sensor of claim 11, wherein the sampling circuit includes:
a plurality of sampling elements, each configured to sample the ramp current flowing on a corresponding one of the plurality of ramp current paths, and store the voltage corresponding to the sampled ramp current.

15. The CMOS image sensor of claim 14, wherein each of the plurality of sampling elements includes:
a first PMOS transistor having a source terminal coupled to a power supply voltage terminal, and having a diode-connection structure such that a gate terminal and a drain terminal are coupled to each other;
a capacitor having a first terminal coupled to a power supply voltage terminal and a second terminal coupled to the gate terminal of the first PMOS transistor, and configured to sample the ramp current, which flows on the corresponding ramp current path, and store the voltage corresponding to the sampled ramp current; and
a switch coupled between the drain terminal of the first PMOS transistor and the current maintaining circuit, and configured to switch on or off the ramp current, which flows on the corresponding ramp current path.

16. The CMOS image sensor of claim 15, wherein the current maintaining/transferring circuit includes
at least one current maintaining/transferring element configured to maintain the current corresponding to the voltage stored in a corresponding sampling block of the sampling circuit; and
a current transferring element configured to transfer the current corresponding to the voltage stored in the corresponding sampling block of the sampling circuit.

17. The CMOS image sensor of claim 16, wherein the at least one current transferring element includes
a second PMOS transistor having a source terminal coupled to the power supply voltage terminal, a gate terminal coupled to the gate terminal of the first PMOS transistor of the sampling circuit, and a drain terminal coupled to the current-to-voltage converter.

18. The CMOS image sensor of claim 16, wherein the at least one current transferring element includes
a third PMOS transistor having a source terminal coupled to the power supply voltage terminal, a gate terminal coupled to the selection circuit and the gate terminal of the first PMOS transistor of the sampling circuit, and a drain terminal coupled to the current-to-voltage converter.

19. The CMOS image sensor of claim 18, wherein the selection circuit includes
a plurality of switches, each having a first terminal coupled to the power supply voltage terminal, and a second terminal coupled between the gate terminal of the first PMOS transistor of the sampling circuit and the gate terminal of the second PMOS transistor of the current maintaining/transferring circuit, and configured to switch on the corresponding ramp current path such that the ramp current flows through the plurality of ramp current paths.

* * * * *